US012745014B1

(12) United States Patent
Lee

(10) Patent No.: US 12,745,014 B1
(45) Date of Patent: Sep. 22, 2026

(54) LAYOUT FOR IMAGING SYSTEM AND PIXEL CELL ARRAY WITH QUAD ROW SELECT TRANSISTORS

(71) Applicant: OMNIVISION TECHNOLOGIES, INC., Santa Clara, CA (US)

(72) Inventor: Sang Joo Lee, Sunnyvale, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 19/214,760

(22) Filed: May 21, 2025

(51) Int. Cl.

| | |
|---|---|
| ***H10F 39/00*** | (2025.01) |
| ***H04N 25/46*** | (2023.01) |
| ***H04N 25/771*** | (2023.01) |
| ***H04N 25/778*** | (2023.01) |

(52) U.S. Cl.
CPC ........... *H04N 25/46* (2023.01); *H04N 25/771* (2023.01); *H04N 25/778* (2023.01); *H10F 39/8037* (2025.01); *H10F 39/811* (2025.01); *H10F 39/813* (2025.01)

(58) Field of Classification Search
CPC ...... H04N 25/46; H04N 25/77; H04N 25/771; H04N 25/778; H10F 39/8037; H10F 39/811; H10F 39/813
See application file for complete search history.

(56) References Cited

U.S. PATENT DOCUMENTS

| | | | |
|---|---|---|---|
| 1,095,184 A | 5/1914 | Benjamin | |
| 11,463,640 B1 | 10/2022 | Wang et al. | |
| 11,652,131 B2 | 5/2023 | Lee et al. | |
| 11,658,202 B2 | 5/2023 | Dai et al. | |
| 12,047,694 B2 | 7/2024 | Lee | |
| 12,356,741 B2 | 7/2025 | Lee | |
| 2015/0029375 A1 | 1/2015 | Sugawa et al. | |
| 2017/0302872 A1 | 10/2017 | Tanaka et al. | |
| 2021/0067726 A1 | 3/2021 | Ashitani et al. | |
| 2024/0145501 A1 | 5/2024 | Lee | |
| 2024/0334088 A1* | 10/2024 | Han ........................ | H04N 25/77 |

OTHER PUBLICATIONS

U.S. Appl. No. 19/214,602 (unpublished) filed May 21, 2025, 70 pages.

Chun Yung Al et al., "0.56 μm-pitch CMOS image sensor for high resolution application", 2023, pp. 1-4, International Image Sensors Society, https://doi.org/10.60928/4t8q-rmzl.

* cited by examiner

*Primary Examiner* — Daniel M Pasiewicz
(74) *Attorney, Agent, or Firm* — Christensen O'Connor Johnson Kindness PLLC

(57) ABSTRACT

A pixel cell array includes a plurality of pixel cells, each including one or more photodiodes configured to generate image charge in response to incident light, a floating diffusion coupled to receive the image charge, a source-follower transistor having a gate coupled to the floating diffusion to generate an image signal at a first source/drain region of the source-follower transistor in response to the image charge in the floating diffusion, a first row select transistor having a first source/drain region coupled to the first source/drain region of the source-follower transistor, and a second row select transistor having a first source/drain region coupled to a second source/drain region of the first row select transistor. The first source/drain regions of the second row select transistors included in a first pixel cell and a second pixel cell included in the plurality of pixel cells are coupled together through a common junction.

20 Claims, 7 Drawing Sheets

LAYOUT FOR IMAGING SYSTEM AND PIXEL CELL ARRAY WITH QUAD ROW SELECT TRANSISTORS

CROSS-REFERENCE TO RELATED APPLICATIONS

This application is related to U.S. patent application Ser. No. 19/214,602, titled "IMAGING SYSTEM AND PIXEL CELL ARRAY WITH QUAD ROW SELECT TRANSISTORS" filed concurrently on May 21, 2025, the contents of which are incorporated herein by reference.

TECHNICAL FIELD

This disclosure relates generally to image sensors, and in particular but not exclusively, relates to complementary metal oxide semiconductor (CMOS) image sensors with pixel binning.

BACKGROUND INFORMATION

Image sensors are one type of semiconductor device that have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, size, etc.) through both device architecture design as well as image acquisition processing. However, it is appreciated that many of these metrics are inversely related. For example, pixel size may be increased to improve dynamic range but have increased noise. In another example, resolution may be increased by increasing the number of pixels, but if pixel size is maintained then the physical size of the image sensor increases. Accordingly, improving one or more performance metrics of semiconductor devices such as image sensors while mitigating adverse effects on other performance metrics remains challenging.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is readout as analog image signals from the column bitlines and converted to digital values to produce digital images (i.e., image data) representative of the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1A:
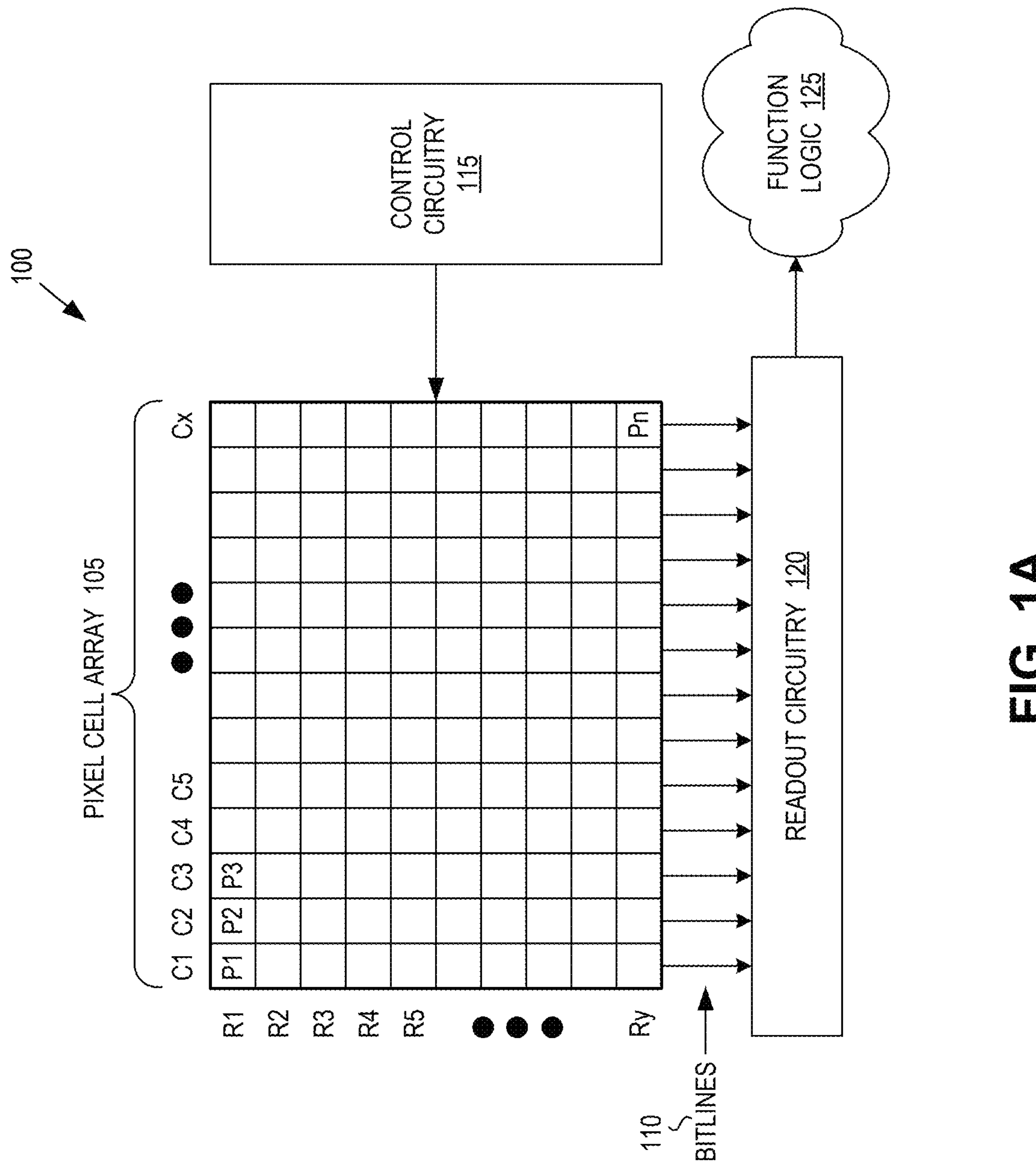
FIG. 1A illustrates an example imaging system (e.g., CIS) including a pixel cell array with quad row select transistors, in accordance with an embodiment of the disclosure.

Embodiments of an apparatus, system, and method each related to a layout for an imaging system and pixel cell array with quad row select transistors are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

It will be understood that, although the terms first, second, third, etc., may be used in the disclosure and claims to describe various elements, these elements should not be limited by these terms and should not be used to determine the process sequence or formation order of associated elements. Unless indicated otherwise, these terms are merely used to distinguish one element from another element. Thus, a first element discussed below could be termed a second element without departing from the teachings of the disclosed embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

In the field of complementary metal oxide semiconductor image sensors (CIS), pixel miniaturization drives product innovation. The pursuit of continuously shrinking pixel sizes, while maintaining or improving performance, forms the foundation of CIS development in recent history. For example, demand for high-resolution mobile image sensors has escalated, with mobile CIS product resolutions increasing from 24 megapixels to 200 megapixels in under 5 years. However, with pixel pitch scaling below the wavelength of visible light, maintaining or improving image sensor performance remains challenging, but may be achieved through a combination of signal processing, architecture design, and fabrication process enhancements.

For example, CIS with a small pixel size (e.g., sub-micron pixel pitch) may utilize a shared pixel structure to account for limited pixel area. In embodiments of the disclosure, the shared pixel structure may be referred to as a pixel cell that includes one or more photodiodes sharing, for example, a same color filter, a same microlens, and/or a same floating diffusion. In some embodiments each pixel cell of a pixel cell array may include a group of four photodiodes (e.g., with a 2×2 arrangement of photodiodes) that share a floating diffusion, a microlens, and/or a color filter. However, it is appreciated that in some embodiments, pixel cells may also be grouped together in larger units based on a color filter pattern arrangement. For example, a color filter pattern (e.g., a Bayer color filter pattern of red, green, and blue color filters) of a CIS may result in groups of photodiodes being configured to detect a same color of light (e.g., groups of 4, 9, 16, etc. photodiodes respectively arranged 2×2, 3×3, 4×4, or other pattern configured to detect a same wavelength range of light by sharing or using a same color filter). In one embodiment, the color filter arrangement may form 2×2 pixel cell units (e.g., for a total of 16 photodiodes per 2×2 pixel cell unit when each pixel cell included in a given 2×2 pixel cell unit comprises four photodiodes using a same color filter to detect a same wavelength range or color of light). It is appreciated that in embodiments of the disclosure, the term "detect a same color of light" and "detect a same wavelength range of light" are interchangeable and may indicate that a same color filter is used for a group of photodiodes based on a color filter pattern. It is further appreciated that the term "color" may include visible colors, non-visible colors, or combinations thereof.

In embodiments of the disclosure, pixel binning may be used to increase CIS sensitivity at the pixel level by adding or combining image charge from multiple photodiodes (e.g., included in a given pixel cell or pixel cell unit) and enabling various modes of resolutions. Examples of binned image signals include a 4C image signal (e.g., corresponding to a combination of image charges from 4 photodiodes configured to detect a same color of light or light within same range of light wavelength such as from a pixel cell disposed under a common color filter that includes a 2×2 arrangement of photodiodes) and a 16C binned image signal (e.g., corresponding to a combination of image charges from 16 photodiodes such as a combination of neighboring 4 pixel cells that each include a 2×2 arrangement of photodiodes). It is appreciated that there may be a trade-off when operating a CIS to read out binned image signals (e.g., 4C image signal, 9C image signal, 16C image signal, or the like) with respect to an unbinned image signals (e.g., 1C image signals). For example, binning provides the advantage of reduced read noise and increased sensitivity at the cost of reduced resolution. Advantageously, embodiments of the disclosure provide flexibility to switch between different modes (e.g., 1C, 4C, 16C, etc.) since in some situations, it may be desirable to capture images at full resolution (i.e., with unbinned image signals) such as for high resolution still image capture while in other situations reduced resolution with high sensitivity may be desirable such as for high speed high definition (HD) video acquisition.

Embodiments of the disclosure describe imaging systems, image sensors, and pixel cell arrays with quad row select transistors. In particular, embodiments of the disclosure describe a layout for a pixel cell array including a plurality of pixel cells arranged in rows and columns. Each pixel cell includes a first and a second row select transistor which are configured (e.g., based on an inter- and/or intra-pixel cell coupling as well as coupling to one or more column bitlines) to enable, inter alia, CIS operation with multiple modes of readout (e.g., 1C, 4C, 16C, or other binned modes), fast pixel binning (e.g., each column analog to digital converter circuit may be active during each of the 1C, 4C and/or 16C modes), and switchable conversion gain (e.g., high conversion gain, low conversion gain, and lateral overflow integration capacitor conversion gain) compatible with each of the readout modes (e.g., 1C, 4C, 16C, or other binned modes) while maintaining or improving performance (e.g., increased conversion gain during high conversion gain operation, reduced read noise, and increased full well capacity for 16C low conversion gain operation).

FIG. 1A illustrates an example imaging system (e.g., CIS) including a pixel cell array 105 with quad row select transistors, in accordance with an embodiment of the disclosure. As shown in the depicted embodiment, imaging system 100 includes or otherwise corresponds to a CIS with pixel array 105, control circuitry 115, readout circuitry 120, function logic 125, and a plurality of column bitlines 110. In one embodiment, pixel cell array 105 is a two-dimensional array including a plurality of pixel cells (e.g., P1, P2, P3, . . . . Pn) that are arranged in rows (e.g., R1 to Ry) and columns (e.g., C1 to Cx) to acquire image data of a person, place, object, etc., which can be used to render an image of the person, place, object, etc. In some embodiments, each of the plurality of pixel cells included in pixel cell array 105 may include one, two, four or more photodiodes that share one or more components (e.g., floating diffusion, color filter, and/or microlens). In the same or different embodiments, each of the plurality of pixel cells included in pixel cell array 105 may include a first row select transistor and a second row select transistor with the second row select transistor shared with or otherwise coupled to the second row select transistor of an adjacent pixel cell. In the same or different embodiments, each of the plurality of pixel cells included in pixel cell array 105 may include one or more capacitors (e.g., floating diffusion, lateral overflow integration capacitor, or the like) selectively coupled to one or more photodiodes.

In some embodiments, control circuitry 115 is coupled to pixel cell array 105 to control operational characteristics of pixel cell array 105 and/or imaging system 100. In one embodiment, control circuitry 115 generates transfer control signals and other control signals (e.g., row select control signals, reset control signals, dual floating diffusion control signals, and the like) to control the transfer and readout of image data from photodiodes included in pixel cells of pixel cell array 105. In the same or other embodiments, control circuitry 115 may generate a shutter signal for controlling image acquisition. In one embodiment, the shutter signal may be a rolling shutter signal such that each row of pixel array 105 is readout sequentially row by row during consecutive acquisition windows. In the same or another embodiment, the shutter signal may also establish an exposure time, which is the length of time that the shutter remains open.

In one embodiment, readout circuitry 120 may be configured to read out image data (e.g., representative of image charge photogenerated by photodiodes included in the plurality of pixel cells in the pixel cell array 105 in response to incident light) through plurality of column bitlines 110. In some embodiments, readout circuitry 120 may include amplification circuitry, analog-to-digital converter (ADC) circuitry, sample-and-hold circuitry, image buffers, or other circuitry components to facilitate converting an analog signal (e.g., image signals) to a digital signal (e.g., image data). Image data output by readout circuitry 120 may then be received by function logic 125. Function logic 125 is coupled to readout circuitry 120 to receive image data to perform image processing operations such as de-mosaicing, color interpolation, denoising, and generating one or more image frames. In some embodiments, the electrical signals and/or image data can be manipulated or otherwise processed by function logic 125 (e.g., apply post image effects such as crop, rotate, remove red eye, adjust brightness, adjust contrast, or otherwise).

Figure 1B:
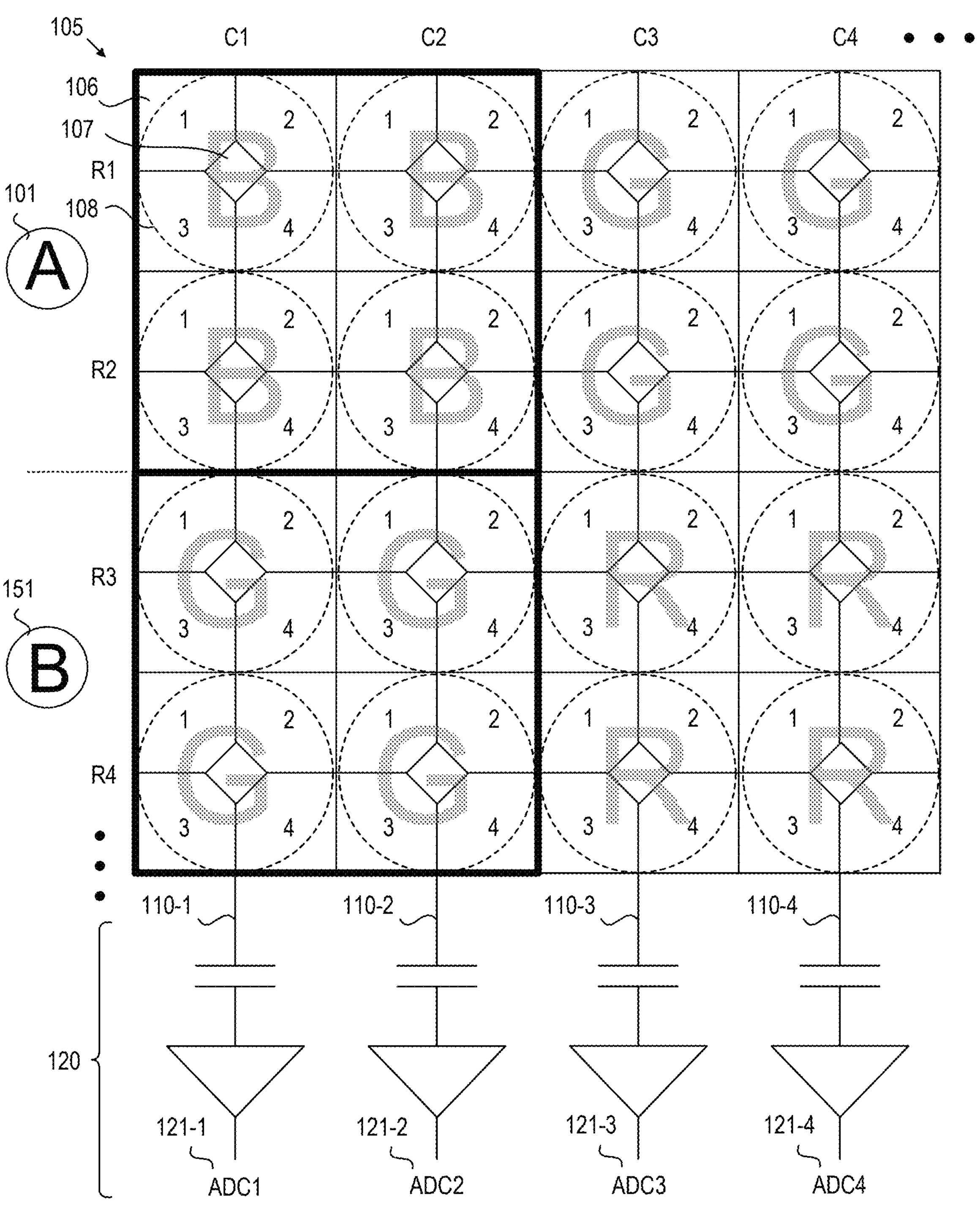
FIG. 1B illustrates a partial view of the pixel cell array illustrated in FIG. 1A, in accordance with an embodiment of the disclosure.

FIG. 1B illustrates a partial view of pixel cell array 105 illustrated in FIG. 1A, in accordance with an embodiment of the disclosure. As illustrated, pixel array 105 includes a plurality of pixel cells arranged in rows (e.g., R1, R2, R3, R4, and so on) and columns (e.g., C1, C2, C3, C4, and so on). In the illustrated embodiment, each pixel cell includes one or more photodiodes (e.g., four photodiodes arranged in a 2×2 pattern with individual photodiodes for a given pixel cell respectively labeled "1," "2," "3," and "4"), a floating diffusion 107 shared by the one or more photodiodes in the given pixel cell, a microlens 108 configured to direct incident light onto the one or more photodiodes through a color filter 106 (e.g., a blue "B" color filter, a green "G" color filter, or a red "R" color filter). In the illustrated embodiment, the color filter pattern is further configured to form 2×2 pixel cell units of 16 photodiodes under the same color filter type including a first 2×2 pixel cell unit 101 (e.g., an "A-cell") and a second 2×2 pixel cell unit 151 (e.g., an "B-cell"). It is appreciated that individual photodiodes included in a given 2×2 pixel cell unit is configured to detect a same color of light.

Each of the 2×2 pixel cell units may further be segmented into pairs of adjacent (e.g., vertically) pixel cells. For example, pixel cell [R1, C1] and pixel cell [R2, C1] form a pair of vertically adjacent pixel cells included in first 2×2 pixel cell unit 101. As will be discussed in embodiments of the disclosure, each pixel cell includes a first row select transistor and a second row select transistor coupled between the first row select transistor and a corresponding column bitline 110 (e.g., 110-1, 110-2, 110-3, 110-4) for readout to an appropriate analog to digital converter circuit 121 (e.g., ADC1 121-1, ADC2 121-2, ADC3 121-3, ADC4 121-4, and so on) included in readout circuitry 120. In the same embodiment, the second row select transistor for adjacent pixel cells included in a given 2×2 pixel cell unit are shared to, inter alia, facilitate pixel binning. In the same or different embodiments, columns of the plurality of pixel cells included in pixel cell array 105 may be associated with or coupled to one or more bitlines included in the plurality of column bitlines 110 (e.g., to facilitate simultaneous or parallel readout of multiple rows). As will be discussed, one of the differences between A-cells (e.g., first 2×2 pixel cell unit 101) and B-cells (second 2×2 pixel cell unit 151) is how second row select transistors are coupled to column bitlines 110. It is appreciated that A-cells and B-cells may be repeated row-wise (e.g., a 2×2 pixel cell unit including pixel cells [R1, C3], [R2, C3], [R1, C4], and [R2, C4] corresponds to an A-cell while a 2×2 pixel cell unit including pixel cells [R3, C3], [R4, C3], [R3, C4], and [R4, C4] corresponds to a B-cell).

It is appreciated that in other embodiments, pixel cells included in pixel cell array 105 may have a different number of photodiodes (e.g., 1 photodiode, 2 photodiodes, 8 photodiodes, 9 photodiodes, etc.), may have a different microlens configuration (e.g., a one-to-one microlens to photodiode ratio), or may have a different color filter pattern arrangement (e.g., with different color filters such as red, green, blue, infrared, clear, transparent, cyan, magenta, yellow, black, or any other color filter to filter visible or non-visible light) with the same or a different pattern.

Figure 2A:
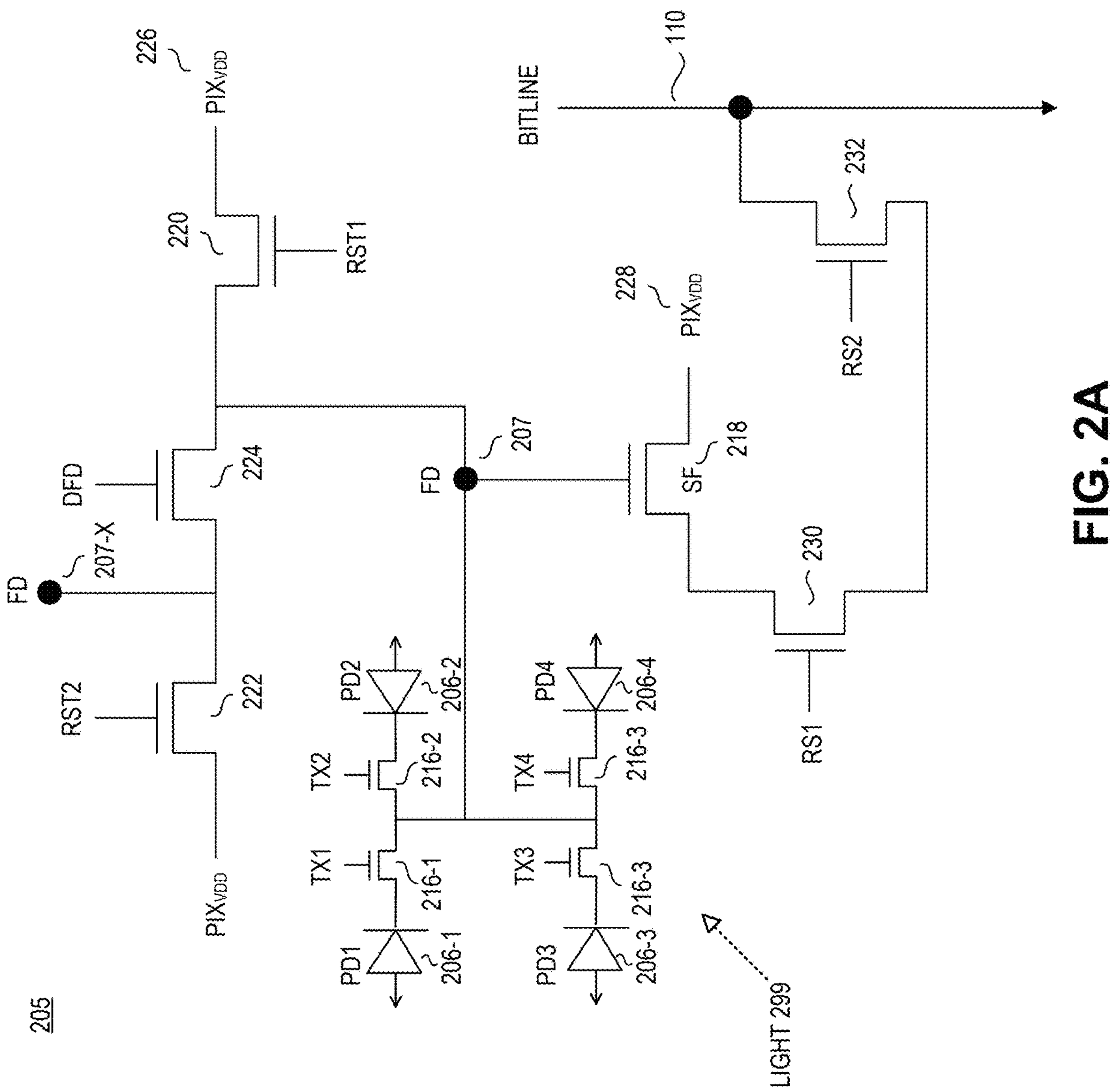
FIG. 2A illustrates an example pixel cell circuit with dual row select transistors, in accordance with an embodiment of the disclosure.

FIG. 2A illustrates an example pixel cell circuit 205 with dual row select transistors, in accordance with an embodiment of the disclosure. Pixel cell circuit 205 is one possible implementation of a pixel cell included in pixel cell array 105 illustrated in FIG. 1A-1B. In some embodiments, each pixel cell included in pixel cell array 105 of FIG. 1A and FIG. 1B may correspond to a respective instance of pixel cell circuit 205. Pixel circuit 205 includes a plurality of photodiodes 206 (e.g., a 2×2 arrangement of photodiodes including photodiodes 206-1, 206-2, 206-3, and 206-4), a floating diffusion 207, a plurality of transfer transistors 216 (e.g., transfer transistors 216-1, 216-2, 216-3, and 216-4 respectively to couple photodiodes 206-1, 206-2, 206-3, and 206-4 to floating diffusion 207), a source-follower transistor 218, a first reset transistor 220, a first row select transistor 230, and a second row select transistor 232. In the illustrated embodiment, pixel cell circuit 205 may further include a second reset transistor 222 and a dual floating diffusion transistor 224. In the illustrated embodiment, transistors associated with pixel cell circuit 205 may be operable (e.g., configurable to an ON or a HIGH state, an OFF or a LOW state, or the like) via control signals (e.g., a voltage or bias) applied or generated by a controller (e.g., included in or otherwise corresponding to control circuitry 115 illustrated in FIG. 1A) to the respective gates. Control signals include transfer control signals TX1, TX2, TX3, and TX4 applied to respective gates of transfer transistors 216-1, 216-2, 216-3, and 216-4, first reset control signal RST1 applied to a gate of first reset transistor 220, a dual floating diffusion control signal DFD applied to a gate of dual floating diffusion transistor 224, a second reset control signal RST2 applied to a gate of second reset transistor 222, a first row select control signal RS1 applied to a gate of first row select transistor 230, and a second row select control signal RS2 applied to a gate of second row select transistor 232.

Photodiodes 206-1, 206-2, 206-3, and 206-4 are configured to photogenerate or otherwise accumulate image charge in response to incident light 299. Specifically, a same spectral filter is disposed over photodiodes 206-1, 206-2, 206-3, and 206-4 as illustrated in FIG. 1B, such that accumulated image charge associated with pixel circuit 205 is representative of a same color light (e.g., red light, green light, blue light, or other ranges of visible or non-visible light). Transfer transistors 216-1, 216-2, 216-3, and 216-4 are coupled to selectively transfer the accumulated image charge to floating diffusion 207 from photodiodes 206-1, 206-2, 206-3, and 206-4 (e.g., individually or in combination). In other words, floating diffusion 207 is shared by photodiodes 206-1, 206-2, 206-3, and 206-4 and is coupled to receive the image charge generated by the plurality of photodiodes 206 (e.g., 206-1, 206-2, 206-3, and/or 206-4) in response to transfer control signals TX1, TX2, TX3, and TX4 applied to respective gates of transfer transistors 216-1, 216-2, 216-3, and 216-4. First reset transistor 220 is coupled between a source 226 (e.g., a voltage source for providing pixel voltage PIXVDD) and floating diffusion 207 to selectively reset floating diffusion 207 to a predetermined voltage level in response to a reset signal RST1 applied to the gate of first reset transistor 220 and, optionally, selectively reset photodiodes 206-1, 206-2, 206-3, and/or 206-4 to the predetermined voltage level (e.g., in response to transfer transistors 216-1, 216-2, 216-3, and/or 216-4 being in an ON state concurrently with first reset transistor 220).

In the illustrated embodiment, pixel cell circuit 205 is a switchable conversion gain pixel cell and includes dual floating diffusion transistor 224 coupled between floating diffusion 207 and a dual floating diffusion capacitor (e.g., floating diffusion 207-X). For example, in the illustrated embodiment floating diffusion 207-X corresponds to the floating diffusion of an adjacent pixel cell that is associated with a different color of light (e.g., if floating diffusion 207 is associated with photodiodes configured to capture blue light, then floating diffusion 207-X is associated with an adjacent pixel cell configured to capture light of a color different than blue light). Put in another way, floating diffusion 207 and floating diffusion 207-X are associated with different 2×2 pixel cell arrangements illustrated in FIG. 1B (e.g., if floating diffusion 207 is associated with the pixel cell in [R3, C3], then floating diffusion 207-X is associated with the pixel cell in [R2, C3]). In response to dual floating diffusion control signal DFD applied to the gate of dual floating diffusion transistor 224, floating diffusions 207 and 207-X are coupled together to increase the effective capacitance available to store image charge. The additional capacitance provided by coupling floating diffusions 207 and 207-X may be useful, for example, for image or video capture in bright light conditions that may otherwise saturate floating diffusion 207 alone. Second reset transistor 222 is coupled between a source (e.g., a voltage source such as PIXVDD) and floating diffusion 207-X to selectively reset floating diffusion 207-X to a predetermined voltage level in response to a reset signal RST2 applied to the gate of second reset transistor 220. It is appreciated that the dual reset transistor configuration enables floating diffusions 207 and 207-X to be reset independently.

Floating diffusion 207 is coupled to the gate electrode of source-follower transistor 218. Source-follower transistor 218 is coupled between a source (e.g., a voltage source such as PIXVDD) and first row select transistor 230. Source-follower transistor 218 is coupled to floating diffusion 207, and optionally floating diffusion 207-X, to generate an image signal in response to image charge in the floating diffusion(s). In other words, source-follower transistor 218 is configured to convert the image charge received at the gate of source-follower transistor 218 from floating diffusion 207, and optionally from floating diffusion 207-X to a corresponding voltage signal (e.g., image signal). First row select transistor 230 is coupled in series between source-follower transistor 218 and second row select transistor 232 to output the image signal to, for example, second row select transistor 232. Second row select transistor 232 is coupled between first row select transistor 230 and one of plurality of column bitlines 110 to send the corresponding image signal from the source-follower transistor 218 to the column bitline in response to row select control signals RS1 and RS2, respectively applied to gates of first row select transistor 230 and second row select transistor 232. In some embodiments, the sources illustrated in FIG. 2A (e.g., source 226 and/or source 228) may correspond to the same or different voltage sources.

Figure 2B:
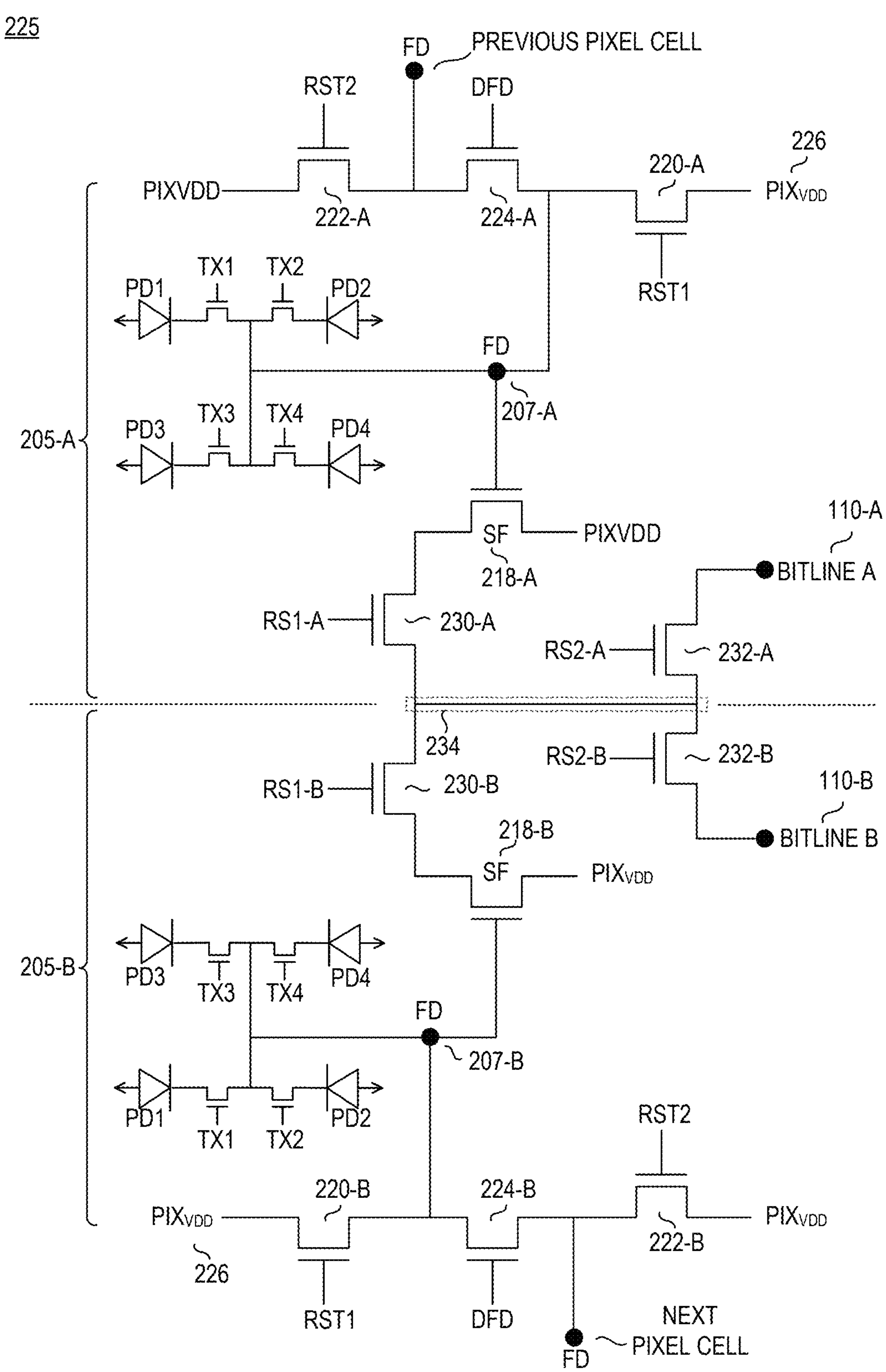
FIG. 2B illustrates two instances of pixel cell circuit illustrated in FIG. 2A with row select transistors coupled together to form a pixel cell unit circuit having quad row select transistors.

FIG. 2B illustrates two instances of pixel cell circuit 205 illustrated in FIG. 2A with row select transistors coupled together to form a pixel cell unit circuit 225 having quad row select transistors, in accordance with an embodiment of the disclosure. Pixel cell unit circuit 225 includes pixel cell circuits 205-A and 205-B and is representative of two adjacent pixel cells (e.g., two vertically adjacent pixel cells such as pixel cell in [R1, C1] and pixel cell in [R2, C1] in FIG. 1B that form a 2×1 pixel cell unit) included in a pixel cell array (e.g., pixel cell array 105 illustrated in FIG. 1A-1B) that are configured to detect light of a same color (e.g., red light, blue light, green light, or other visible or non-visible light). In some embodiments, pixel cell unit circuit 225 is representative of a pair of adjacent pixel cells including a first pixel cell (e.g., pixel cell circuit 205-A) and a second pixel cell (e.g., pixel cell 205-B) vertically adjacent to the first pixel cell with the first pixel cell and the second pixel cell configured to detect light having a same color. Pixel cell circuits 205-A and 205-B each include respective instances of a plurality of photodiodes (e.g., PD1~PD4) transfer transistors, floating diffusions (e.g., 207-A and 207-B), source-follower transistors (e.g., 218-A and 218-B), first reset transistors (e.g., 220-A and 220-B), second reset transistors (e.g., 222-A and 222-B), dual floating diffusion transistors (e.g., 224-A and 224-B), first row select transistors (e.g., 230-A and 230-B), and second row select transistors (e.g., 232-A and 232-A).

Figure 2C:
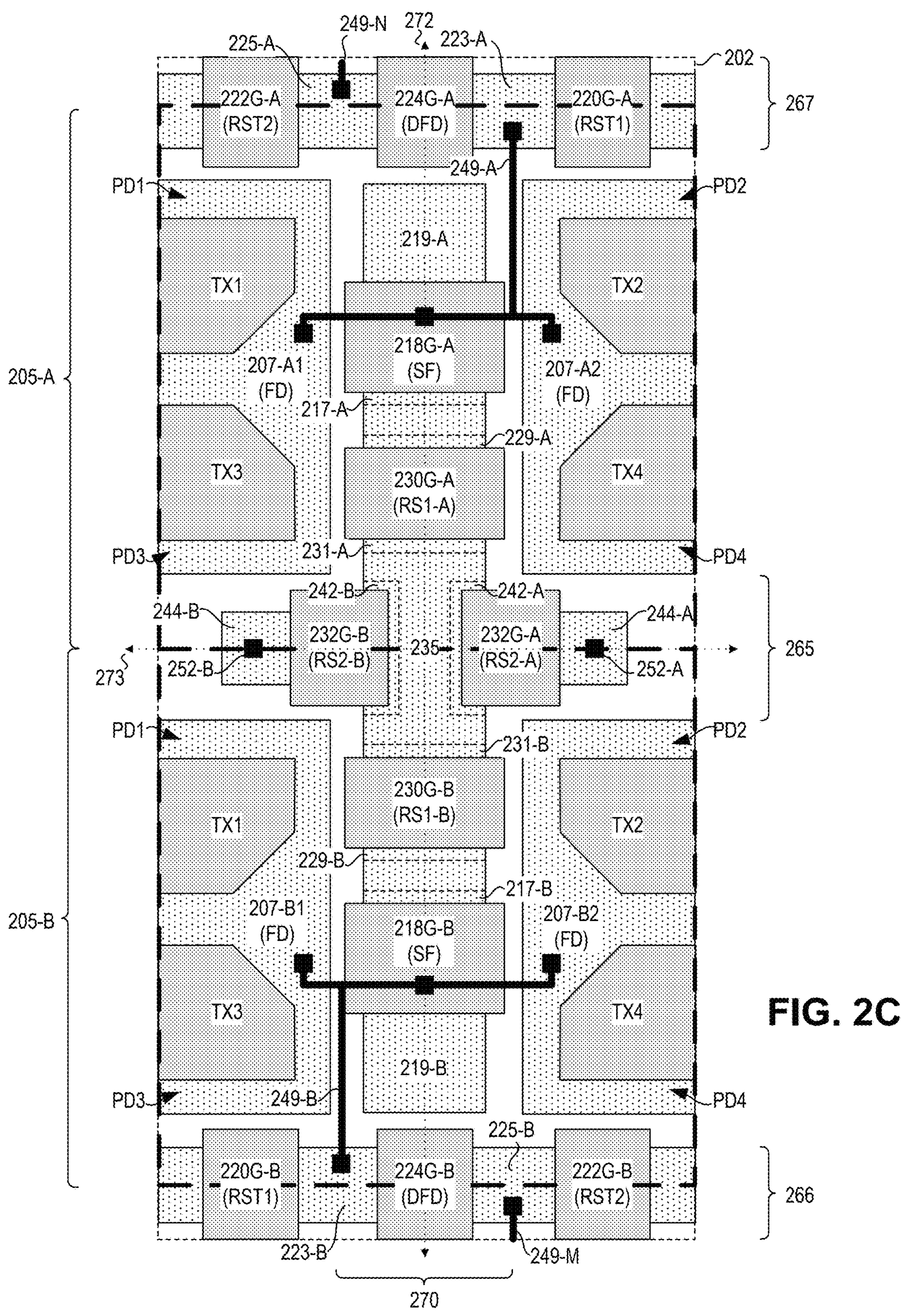
FIG. 2C illustrates an example layout for the pixel cell unit circuit illustrated in FIG. 2B with quad row select transistors, in accordance with an embodiment of the disclosure.

In the illustrated embodiment, the first row select transistors (e.g., 230-A and 230-B) and the second row select transistors (e.g., 232-A and 232-B) included in the pair of adjacent pixel cells 205-A and 205-B are coupled together to output an image signal from either of first row select transistors 230-A or 230-B to either of second row select transistors 232-A or 232-B. Put in another way, second row select transistors 232-A and 232-B are shared by both pixel cell 205-A and pixel cell 205-B. For example, second row select transistors 232-A and 232-B are each coupled to first row select transistor 230-A and first row select transistor 230-B. In the illustrated embodiment, first row select transistor 230-A of pixel cell 205-A is coupled between source-follower transistor 218-A of pixel cell 205-A and second row select transistor 232-B of pixel cell 205-B. In the same embodiment, first row select transistor 230-B of pixel cell 205-B is coupled between source-follower transistor 218-B of pixel cell 205-B and second row select transistor 232-A of pixel cell 205-A. In one embodiment, first row select transistor 230-A, first row select transistor 230-B, second row select transistor 232-A, and second row select transistor 232-B are directly coupled together through a junction connection to form a 4-terminal node 234. In such an embodiment, source/drain portions of first row select transistors 230-A and 230-B may be coupled directly to the source/drain portions of second row select transistors 232-A and 232-B through a common junction (e.g., a common doped region within a semiconductor material to form a shared silicon junction as illustrated in FIG. 2C and FIG. 2E). Advantageously, such an embodiment may enable first row select transistor 230-A, first row select transistor 230-B, second row select transistor 232-A, and second row select transistor 232-B to be directly coupled together without any metal wiring connection therebetween, which includes many benefits such as more efficient space utilization, reduced cost, reduce line capacitance, and the like. In some embodiments, device characteristics (e.g., gate dimensions, channel characteristic, threshold voltages, and the like) of first row select transistor 230-A, first row select transistor 230-B, second row select transistor 232-A, and second row select transistor 232-B are substantially identical.

Depending on a configuration (i.e., state) of second row select transistors 232-A and 232-B, an image signal associated with the first pixel cell (e.g., 205-A) may be selectively output through first row select transistor 230-A of pixel cell 205-A to second row select transistor 232-A of pixel cell 205-A or to second row select transistor 232-B of pixel cell 205-B. Similarly, an image signal associated with the second pixel cell (e.g., 205-B) may be selectively output through first row select transistor 230-B of pixel cell 205-B to second row select transistor 232-A of pixel cell 205-A or to second row select transistor 232-B of pixel cell 205-B. As illustrated, second row select transistor 232-A of pixel cell 205-A is coupled to column bitline 110-A while second row select transistor 232-B of pixel cell 205-B is coupled to column bitline 110-B. Consequently, first row select transistors (e.g., 230-A and 230-B) and second row select transistors (e.g., 232-A and 232-B) of a pair of adjacent pixel cells (e.g., vertically adjacent pixel cells 205-A and 205-B) may be configured to selectively output an image signal associated with either of the pixel cells included in the adjacent pixel cells (e.g., pixel cell 205-A or 205-B) to the same or different column bitlines (e.g., either of column bitlines 110-A or 110-B). It is appreciated that in embodiments of the disclosure, column bitlines 110-A and 110-B may correspond to the same or different bitlines. As will be discussed subsequently, the quad row select configuration that includes first row select transistors (e.g., 230-A and 230-B) and second row select transistors (e.g., 232-A and 232-B) included in an adjacent pair of pixel cells (e.g., vertically adjacent pixel cells 205-A and 205-B) may be utilized to enable individual pixel readout (e.g., 1C) as well as fast pixel binning (e.g., 4C and 16C operation), in accordance with embodiments of the disclosure.

FIG. 2C illustrates an example layout for pixel cell unit circuit 225 illustrated in FIG. 2B with quad row select transistors, in accordance with an embodiment of the disclosure. The illustrated embodiment includes, inter alia, doped regions (e.g., PD1, PD2, PD3, PD4, 207-A1, 207-A2, 207-B1, 207-B2, 217-A, 217-B, 219-A, 219-B, 223-A, 223-B, 225-A, 225-B, 229-A, 229-B, 231-A, 231-B, 242-A, 242-B, 244-A, and 244-B, 235) of semiconductor material 202 (e.g., silicon, a silicon germanium alloy, germanium, a silicon carbide alloy, an indium gallium arsenide alloy, any other alloys formed of III-V group compounds, combinations thereof, one or more epitaxial layers of the aforementioned materials, or a bulk substrate thereof), gate electrodes (e.g., 218G-A, 218G-B, 220G-A, 220G-B, 222G-A, 222G-B, 224G-A, 224G-B, 230G-A, 230G-B, 232G-A, and 232G-B) formed of a conductive material (e.g., silicon, polycrystalline silicon, and the like) and formed in or on semiconductor material 202, and interconnects (e.g., 249-A and 249-B) formed of a conductive material (e.g., silicon, polycrystalline silicon, metal, or other conductive material) coupling gate electrodes and/or doped regions together to collectively form a representation of pixel cell unit circuit 225 illustrated in FIG. 2B.

It is appreciated that the term "photodiode" (e.g., PD1, PD2, PD3, PD4) correspond to a doped region (e.g., via implantation) disposed within or otherwise surrounded by an oppositely doped region to form a photosensitive area capable of photogenerating image charge in response to incident light. For example, PD1, PD2, PD3, and PD4 illustrated in FIG. 2C may correspond to an N-type semiconductor (e.g., N-doped silicon) disposed within a P-type semiconductor material (e.g., P-type silicon corresponding to semiconductor material 202). Accordingly, in some embodiments photodiode (e.g., PD1, PD2, PD3, and PD4) are oppositely doped (e.g., opposite conductivity type) relative to a doping type of semiconductor material 202. In some embodiments, other doped regions (e.g., 207-A1, 207-A2, 207-B1, 207-B2, 217-A, 217-B, 219-A, 219-B, 223-A, 223-B, 225-A, 225-B, 229-A, 229-B, 231-A, 234, 242-A, 242-B, 244-A, and 244-B, 234) may have a same conductivity type as photodiodes PD1, PD2, PD3, and PD4.

It is appreciated that reference labels with a "G" suffix correspond a gate electrode of the referenced label (e.g., 218G corresponds to a gate electrode of source-follower transistor 218). It is further appreciated that reference labels may be further suffixed by an "A" or a "B" to indicate whether the element is part of a first pixel cell (e.g., pixel cell 205-A) or a second pixel cell (e.g., pixel cell 205-B) that is adjacent (e.g., vertically) to the first pixel cell. Additionally, it is appreciated that reference to transistors may be done with respect to FIG. 2B when associated components of FIG. 2C are discussed (e.g., gate 218G-A illustrated in FIG. 2C corresponds to the gate electrode of source-follower transistor 218-A illustrated in FIG. 2B). It is further appreciated that doped regions may be segmented by a dashed line and described as being coupled together (e.g., first source/drain region 217-A of source-follower transistor 218-A may be referred to as coupled to first source/drain region 229-A of first row select transistor 230-A), but it is appreciated that such a segmentation may be for the sake of discussion and that in some embodiments the coupled doped regions form continuous or contiguous doped region in semiconductor material 202. Additionally, it is appreciated that not every element of FIG. 2C is necessarily labeled or discussed. Rather, one of ordinary skill in the art will be able to interpret elements of FIG. 2C based on the context of other embodiments throughout the disclosure.

Pixel cell 205-A includes, inter alia, gate 218G-A of source-follower transistor 218-A, gate 230G-A of first row select transistor 230-A, gate 232G-A of second row select transistor 232-A, gate 220G-A of reset transistor 220-A, gate 222G-A of reset transistor 222-A, gate 224G-A of dual floating diffusion transistor 224-A, first source/drain region 217-A of source-follower transistor 218-A, second source/drain region 219-A of source-follower transistor 218-A, first source/drain region 229-A of first row select transistor 230-A, second source/drain region 231-A of first row select transistor 230-A, first source/drain region 242-A of second row select transistor 232-A, source/drain region 223-A, source/drain region 225-A, and floating diffusion 207-A (collectively represented by first portion 207-A1 and second portion 207-A2).

Pixel cell 205-B includes, inter alia, gate 218G-B of source-follower transistor 218-B, gate 230G-B of first row select transistor 230-B, gate 232G-B of second row select transistor 232-B, gate 220G-B of reset transistor 220-B, gate 222G-B of reset transistor 222-B, gate 224G-B of dual floating diffusion transistor 224-B, first source/drain region 217-B of source-follower transistor 218-B, second source/drain region 219-B of source-follower transistor 218-B, first source/drain region 229-B of first row select transistor 230-B, second source/drain region 231-B of first row select transistor 230-B, first source/drain region 242-B of second row select transistor 232-B, source/drain region 223-B, source/drain region 225-B, and floating diffusion 207-B (collectively represented by first portion 207-B1 and second portion 207-B2).

In the illustrated embodiment, pixel cell 205-A and pixel cell 205-B are vertically adjacent (e.g., located in a same column) and arranged to define horizontal transistor regions (e.g., transistor regions 265, 266 or 267) that extend parallel to a row direction (e.g., direction 273) and vertical transistor regions (e.g., transistor region 270) that extend parallel to a column direction (e.g., direction 272) . . . . It is appreciated that in some embodiments column directions are perpendicular to row directions (e.g., direction 272 is perpendicular to direction 273). It is further appreciated that in some embodiments column directions are parallel with column bitlines (e.g., column bitlines 110 illustrated in FIG. 1A-1B) and row directions are parallel to control lines coupled to gate electrodes such as transfer control lines, row select control lines, reset control lines, and the like. As illustrated, the horizontal and vertical transistor regions laterally surround photodiodes (e.g., PD1, PD2, PD3, and PD4) within semiconductor material 202 of a given pixel cell (e.g., pixel cells 205-A and 205-B). In some embodiments, the vertical transistor regions (e.g., transistor region 270) are disposed between pairs of photodiodes within a given pixel cell. In one embodiment, transistor region 270 is disposed between a first pair of adjacent photodiodes (e.g., PD1 and PD3) of pixel cell 205-A and a second pair of adjacent photodiodes (e.g., PD2 and PD4) of pixel cell 205-A. In some embodiments, the horizontal transistor regions (e.g., transistor region 265, 266, or 267) are disposed between pairs of photodiodes for adjacent pixel cells. In one embodiment, transistor region 265 is disposed between the first pair of adjacent photodiodes (e.g., PD1 and PD3) of pixel cell 205-A and a first pair of adjacent photodiodes (e.g., PD1 and PD3) of pixel cell 205-B. It is appreciated that various components (e.g., gates, source/drain regions, etc.) included in pixel cells 205-A and 205-B are positioned or otherwise arranged in transistor regions 270, 265, 266, and 267 as illustrated in FIG. 2C.

Pixel cell 205-A includes floating diffusion 207-A (e.g., formed collectively by first portion 207-A1 and a second portion 207-A2) and pixel cell 205-B includes floating diffusion 207-B (e.g., formed collectively by first portion 207-B1 and a second portion 207-B2) each coupled to receive image charge generated by one or more photodiodes included in the respective pixel cell (e.g., PD1, PD2, PD3, and/or PD4 respectively included in pixel cell 205-A or 205-B). For example, floating diffusion 207-A1 is coupled to receive image charge generated by photodiodes PD1 and PD3 while floating diffusion 207-A2 is coupled to receive image charge generated by photodiodes PD2 and PD4. Referring to pixel cell 205-A, gate 218G-A of source-follower transistor 218-A is coupled to floating diffusion 207-A to generate an image signal at a first source/drain region 217-A of source-follower transistor 218-A in response to image charge in floating diffusion 207-A. Referring to pixel cell 205-B, gate 218G-B of source-follower transistor 218-B is coupled to floating diffusion 207-B to generate an image signal at a first source/drain region 217-B of source-follower transistor 218-B in response to image charge in floating diffusion 207-B. Put in another way, floating diffusion 207-A and 207-B are each split floating diffusions having respective first portions (e.g., first portion 207-A1 or 207-A2) and second portions (e.g., second portion 207-A2 or 207-B2) formed in semiconductor material 202 that are physically separated from one another (i.e., the first portion is physically separated from the second portion), for example, by an isolation structure such as a shallow trench isolation structure. In the illustrated embodiment, first portion 207-A1 is disposed between a first pair of photodiodes (e.g., PD1 and P3 of pixel cell 205-A) and gate 218G-A of source-follower transistor 218-A. In the same embodiment, second portion 207-A2 is disposed between a second pair of photodiodes (e.g., PD2 and P4 of pixel cell 205-A) and gate 218G-A of source-follower transistor 218-A. Similarly, first portion 207-B1 is disposed between a first pair of photodiodes (e.g., PD1 and P3 of pixel cell 205-B) and gate 218G-B of source-follower transistor 218-B. In the same embodiment, the second portion 207-B2 is disposed between a second pair of photodiodes (e.g., PD2 and P4 of pixel cell 205-B) and gate 218G-B of source-follower transistor 218-B.

In the illustrated embodiment, first source/drain region 229-A of first row select transistor 230-A is coupled to first source/drain region 217-A of source-follower transistor 218-A to output an image signal. Similarly, first source/drain region 229-B of first row select transistor 230-B is coupled to first source/drain region 217-B of source-follower transistor 218-B to output an image signal. In the same embodiment, first source/drain region 242-A of second row select transistor 232-A is coupled to second source/drain region 231-A of first row select transistor 230-A. Similarly, first source/drain region 242-B of second row select transistor 232-B is coupled to second source/drain region 231-B of first row select transistor 230-B.

As discussed previously, second row select transistors 232-A and 232-B of first pixel cell 205-A and second pixel cell 205-B are shared to, inter alia, facilitate pixel binning or otherwise operating a given 2×2 pixel cell unit that includes pairs of adjacent pixel cells (e.g., first 2×2 pixel cell unit 101 and second 2×2 pixel cell unit 151 illustrated in FIG. 1B) in different modes (e.g., 1C, 4C, 16C) of readout. FIG. 2C illustrates one way second row select transistors 232-A and 232-B are shared by both pixel cells 205-A and 205-B such that first row select transistors 230-A and 230-B may be selectively coupled to second row select transistors 232-A and 232-B.

Specifically, first source/drain region 242-A of second row select transistor 232-A and first source/drain region 242-B of second row select transistor 232-B are directly coupled together through common junction 235. It is appreciated that common junction 235 is one way to form 4-terminal node 234 illustrated in FIG. 2B. In such a manner, second row select transistor 232-A and second row select transistor 232-B may be directly coupled together without any metal wiring (e.g., a common or same junction extends from proximate gate 232G-A to proximate gate 232G-B). The direct connection between second row select transistors 232-A and 232-B provides reduced cost, increased space utilization efficiency, and reduced line or interconnect capacitance between second row select transistors 232-A and 232-B. In some embodiments, first source/drain region 242-A of second row select transistor 232-A is also coupled to second source/drain region 231-A of first row select transistor 230-A through common junction 235 for pixel cell 205-A. In the same embodiment, first source/drain region 242-B of second row select transistor 232-B is also coupled to second source/drain region 231-B of first row select transistor 230-B through common junction 235 for pixel cell 205-B. Put in another way, common junction 235 (e.g., a doped region of semiconductor material 202) forms a 4-terminal node directly coupling first row select transistors (i.e., 230-A and 230-B) and second row select transistors (i.e., 232-A and 232-B) together of first and second pixel cells included in a pair of adjacent pixel cells (i.e., pixel cells 205-A and 205-B) through a junction connection within semiconductor material 202 without the need for any metal wiring to avoid increasing wiring density in metal layer(s).

In the illustrated embodiment, common junction 235 is disposed in semiconductor material 202 via a same doped region within transistor region 265 between the one or more photodiodes of pixel cell 205-A and the one or more photodiodes of pixel cell 205-B. In some embodiments, the same doped region can be formed via ion implantation with alignment made to the edges of gates 230G-A, 230G-B, 232G-A, and 232G-B. In some embodiments, a cross-section of the illustrated portion of a pixel cell array along direction 272 parallel to a column direction extends through transistor region 265, common junction 235, gates of source-follower transistors included in pixel cells 205-A and 205-B (e.g., gate 218G-A of source-follower transistor 218-A of pixel cell 205-A and gate 218G-B of source-follower transistor 218-B of pixel cell 205-B), and gates of the first row select transistors including in pixel cells 205-A and 205-B (e.g., gate 230G-A of first row select transistor 230-A of pixel cell 205-A and gate 230G-B of first row select transistor 230G-B of pixel cell 205-B). In some embodiments, gate 230G-A of first row select transistor 230-A included in pixel cell 205-A and gate 230G-B of first row select transistor 230-B included in pixel cell 205-B are disposed between gate 218G-A of source-follower transistor 218-A included in pixel cell 205-A and gate 218G-B of source-follower transistor 218-B included in pixel cell 205-B. In the same or other embodiments, gates of the source-follower transistors (e.g., 218G-A and 218G-B) and/or the first row select transistors (e.g., 230G-A and 230G-B) included in pixel cells 205-A and 205-B are aligned (e.g., a straight line is coincident with edges or midpoints of each of the aforementioned gates). In the same or other embodiments, gates of the second row select transistors (e.g., 232G-A and 232G-B) included in pixel cells 205-A and 205-B are aligned (e.g., a straight line is coincident with edges or midpoints of each of the aforementioned gates).

As illustrated in FIG. 2C, gate 230G-A of first row select transistor 230-A included in pixel cell 205-A is disposed between a pair of photodiodes included in one or more photodiodes of pixel cell 205-A (e.g., PD3 and PD4 of pixel cell 205-A). In the same embodiment, gate 230G-B of first row select transistor 230-B included in pixel cell 205-B is disposed between a pair of photodiodes included in the one or more photodiodes of pixel cell 205-B (e.g., PD1 and PD2 of pixel cell 205-B). In the illustrated embodiment, common junction 235 is disposed between gate 230G-A of first row select transistor 230-A included in the pixel cell 205-A and gate 232G-B of second row select transistor 232-B included in pixel cell 205-B. Common junction 235 is also disposed between gate 230G-A of first row select transistor 230-A included in the pixel cell 205-A and gate 232G-A of second row select transistor 232-A included in pixel cell 205-A. In the illustrated embodiment, common junction 235 is disposed between gate 230G-B of first row select transistor 230-B included in the pixel cell 205-B and gate 232G-B of second row select transistor 232-B included in pixel cell 205-B. Common junction 235 is also disposed between gate 230G-B of first row select transistor 230-B included in the pixel cell 205-B and gate 232G-A of second row select transistor 232-A included in pixel cell 205-A.

In the illustrated embodiment, gate 224G-A of dual floating diffusion transistor 224-A is disposed between gate 220G-A of first reset transistor 220-A and gate 222G-A of second reset transistor 222-A. In some embodiments, gates 224G-A, 220G-A, and 222G-A are substantially aligned (e.g., a straight line is coincident with edges or midpoints of each of the aforementioned gates). Similarly, gate 224G-B of dual floating diffusion transistor 224-B is disposed between gate 220G-B of first reset transistor 220-B and gate 222G-A of second reset transistor 222-B. In some embodiments, gates 224G-B, 220G-B, and 222G-B are aligned (e.g., a straight line is coincident with edges or midpoints of each of the aforementioned gates). As illustrated, gate 218G-A of source-follower transistor 218-A is disposed between gate 224G-A of dual floating diffusion transistor 224-A and gate 230G-A of first row select transistor 230-A. In the same embodiment, gate 218G-B of source-follower transistor 218-B is disposed between gate 224G-B of dual floating diffusion transistor 224-B and gate 230G-B of first row select transistor 230-B.

As illustrated, common junction 235 is coupled between gate 230G-A of first row select transistor 230-A included in pixel cell 205-A and gate 230G-B of first row select transistor 230-B included in pixel cell 205-B. Common junction 235 is further coupled between gate 232G-A of second row select transistor 232-A of pixel cell 205-A and gate 232G-A of second row select transistor 232-B included in pixel cell 205-B.

As discussed previously interconnects 249-A, 249-B, 249-N, 249-M, 252-A and 252-B (e.g., one or more metal or conductive vias, traces, or combination thereof) couple one or more components included in the pixel cell array or the associated imaging system together. In the illustrated embodiment, interconnect 249-A couples floating diffusion portions (i.e., first portion 207-A1 and second portion 207-A2) to gate 218G-A of source-follower transistor 218-A together. Interconnect 249-A further couples first portion 207-A1, second portion 207-A2, and gate 218G-A to source/drain region 223-A. Interconnect 249-N couples source/drain region 225-A to a floating diffusion of an adjacent pixel cell configured to detect light of a different color or otherwise to an unillustrated capacitor such that when dual floating diffusion transistor 224-A is turned on capacitance for charge storage may be selectively increased (e.g., for switchable conversion gain operation). Additionally, interconnect 249-A facilitates reset operation of first portion 207-A1, second portion 207-A2, and photodiodes regions (e.g., PD1, PD2, PD3, PD4) of pixel cell 205-A. Similarly, interconnect 249-B couples floating diffusion portions (i.e., first portion 207-B1 and second portion 207-B2) to gate 218G-B of source-follower transistor 218-B together. Interconnect 249-B further couples first portion 207-B1, second portion 207-B2, and gate 218G-B to source/drain region 223-B. Interconnect 249-M couples source/drain region 225-B to a floating diffusion of an adjacent pixel cell configured to detect light of a different color or otherwise to an unillustrated capacitor such that when dual floating diffusion transistor 224-B is turned on capacitance for charge storage may be selectively increased (e.g., for switchable conversion gain operation). Additionally, interconnect 249-B facilitates reset operation of first portion 207-B1, second portion 207-B2, and photodiodes regions (e.g., PD1, PD2, PD3, PD4) of pixel cell 205-B.

As previously discussed, second row select transistors 232-A and 232-B may be coupled to the same of different column bitlines (e.g., column bitlines 110-A and 110-B illustrated in FIG. 2B). FIG. 2C illustrates second source/drain region 244-A of second row select transistor 232-A coupled to a column bitline through interconnect 252-A. FIG. 2C further illustrates second source/drain region 244-B of second row select transistor 232-B coupled to a column bitline through interconnect 252-B. In the illustrated embodiment, gate 232G-A of second row select transistor 232-A included in pixel cell 205-A is disposed between common junction 235 and second source/drain region 244-A of second row select transistor 232-A included in pixel cell 205-A. In the same embodiment, gate 232G-B of second row select transistor 232-B included in pixel cell 205-B is disposed between common junction 235 and second source/drain region 244-B of second row select transistor 232-B included in pixel cell 205-B. In some embodiments, second source/drain regions 244-A and 244-B of the second row select transistors 232-A and 232-B included in pixel cells 205-A and 205-B are coupled to a same column bitline (e.g., bitline 110-A illustrated in FIG. 1B) through interconnect 252-A and 252-B, respectively. In other embodiments, second source/drain regions 244-A and 244-B of the second row select transistors 232-A and 232-B included in pixel cells 205-A and 205-B are coupled to a different column bitlines that are adjacent to one another (e.g., bitlines 110-A and 110-B, respectively, illustrated in FIG. 1B) respectively through interconnects 252-A and 252-B.

Figure 2D:
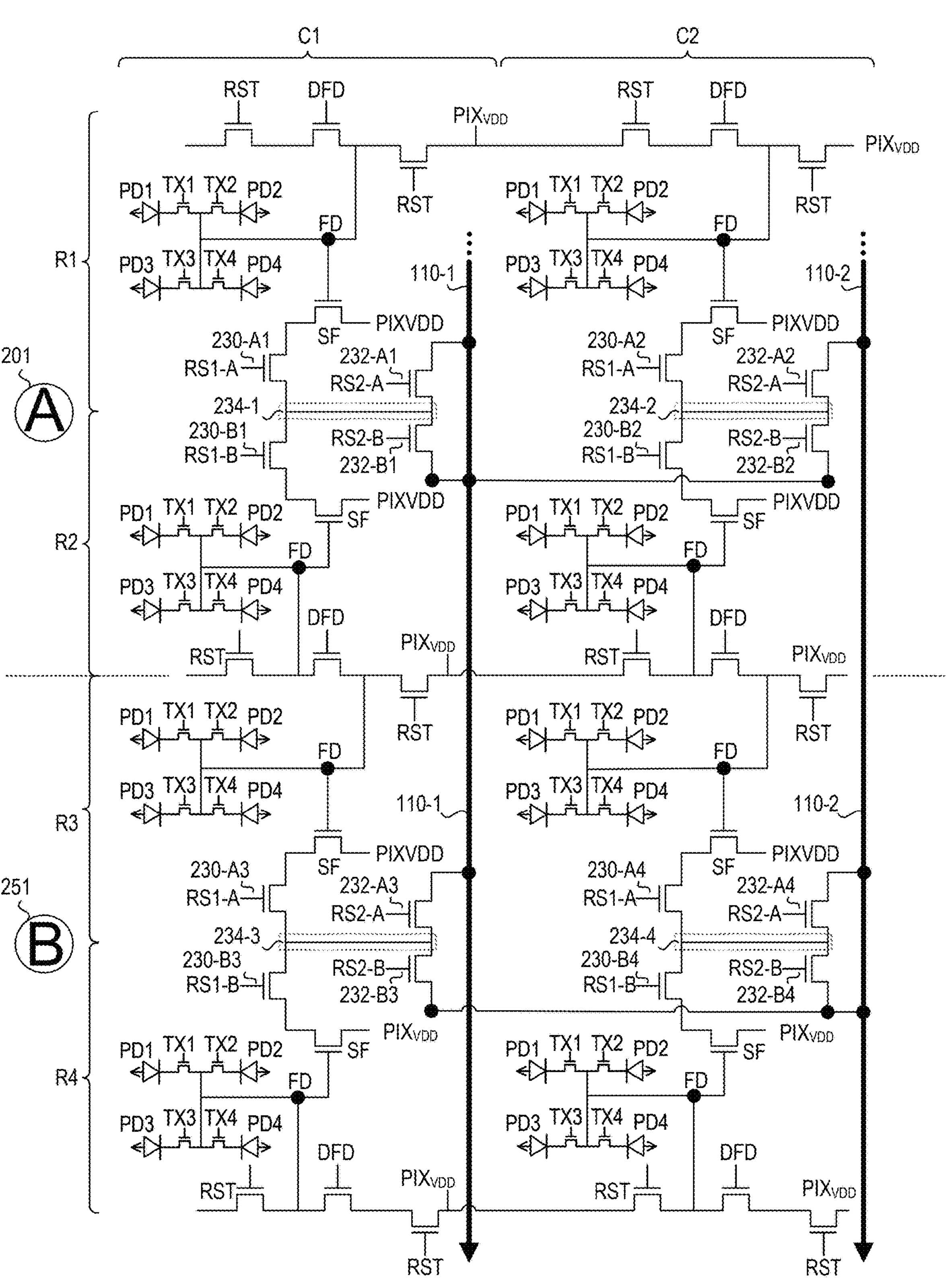
FIG. 2D illustrates a plurality of 2×2 pixel cell units that each include two instances of pixel cell circuit of FIG. 2B, in accordance with an embodiment of the disclosure.
Figure 2E:
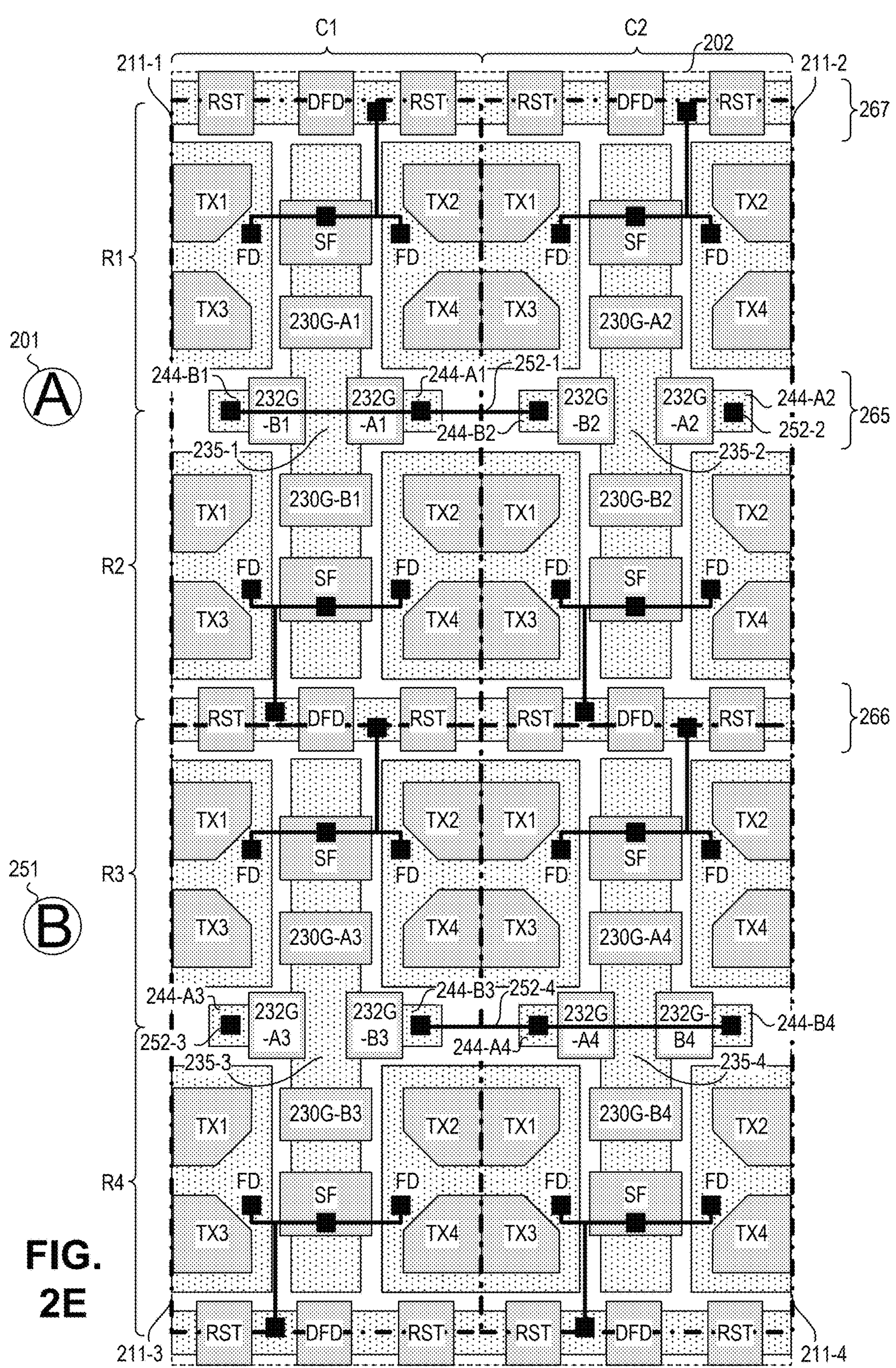
FIG. 2E illustrates an example layout for the 2×2 pixel cell units of FIG. 2D, in accordance with an embodiment of the disclosure.

FIG. 2D illustrates a plurality of 2×2 pixel cell units that each include two instances of pixel cell circuit 225 of FIG. 2B, in accordance with an embodiment of the disclosure. In some embodiments, FIG. 2D is representative of two vertically adjacent 16C pixel cells included in pixel cell array 105 illustrated in FIG. 1B. For example, pixel cells [R1, C1], [R1, C2], [R2, C1], and [R2, C2] collectively form a first 2×2 pixel cell unit 201 (e.g., an "A-cell") and pixel cells [R3, C1], [R3, C2], [R4, C1], and [R4, C2] collectively form a second 2×2 pixel cell unit 251 (e.g., a "B-cell") that may respectively represent 2×2 pixel cell units 101 and 151 illustrated in FIG. 1B. In the illustrated embodiment, first 2×2 pixel cell unit 201 and second 2×2 pixel cell unit 251 are configured to detect light having different colors (e.g., photodiodes included in first 2×2 pixel cell unit 201 are configured to detect a first color and photodiodes included in second 2×2 pixel cell unit 251 are configured to detect a second color different from the first color). As previously discussed, colors of light may include red light, blue light, green light, or other visible or non-visible light.

In the illustrated embodiment, pixel cells may be segmented into pairs of adjacent pixel cells, with each one of the pairs of adjacent pixel cells including a first pixel cell and a second pixel cell (e.g., as illustrated in FIG. 2B-2C showing an example circuit diagram and layout for a pair of vertically adjacent pixel cells). Each of the first and the second pixel cells of a given one of the pairs of adjacent pixel cells include respective first and second row select transistors that are coupled together, which is indicated by the naming convention for labels of the first and second row select transistors. For example, first and second row select transistors that end in a same number suffix (e.g., 1, 2, 3, 4, etc.) are coupled together (e.g., first row select transistors 230-A1, 230-B1 and second row select transistors 232-A1, 230-B1 are coupled together). It is further appreciated that the letter suffix for the first and second row select transistors indicates whether the given row select transistor is included in the "first pixel cell" or the "second pixel cell" of a given one of the pairs of adjacent pixel cells (e.g., "A" indicates the row select transistor is included in the first pixel cell of a given one of the pairs of adjacent pixel cells while "B" indicates the row select transistor is included in the second pixel cell of the given one of the pixel cells). It is appreciated that each one of the pairs of adjacent pixel cells includes four row select transistors (i.e., two first row select transistors and two second row select transistors). In the illustrated embodiment, a first one of the pairs of adjacent pixel cells includes first row select transistor 230-A1, second row select transistor 232-A1, first row select transistor 230-B1, and second row select transistor 232-B1 coupled directly together through 4-terminal node 234-1. A second one of the pairs of adjacent pixel cells includes first row select transistor 230-A2, second row select transistor 232-A2, first row select transistor 230-B2, and second row select transistor 232-B2 coupled directly together through 4-terminal node 234-2. A third one of the pairs of adjacent pixel cells includes first row select transistor 230-A3, second row select transistor 232-A3, first row select transistor 230-B3, and second row select transistor 232-B3 coupled directly together through 4-terminal node 234-3. A fourth one of the pairs of adjacent pixel cells includes first row select transistor 230-A4, second row select transistor 232-A4, first row select transistor 230-B4, and second row select transistor 232-B4 coupled directly together through 4-terminal node 234-4.

In the illustrated embodiment, the configuration of the first and the second row select transistors included in first 2×2 pixel cell unit 201 and second 2×2 pixel cell unit 251 facilitates operation in 1C, 4C, and 16C modes for each pixel cell unit. Additionally, during 16C mode, the configuration of first and second row select transistors allows for simultaneous readout of first 2×2 pixel cell unit 201 and second 2×2 pixel cell unit 251 (e.g., all pixels in rows R1, R2, R3, and R4 may be simultaneously readout to generate respective binned signals). In some embodiments, A-cells and B-cells may be alternated along a column direction (e.g., subsequent unillustrated rows R5 and R6 would include instance(s) of first 2×2 pixel cell unit 201 and unillustrated rows R7 and R8 would include instance(s) of second 2×2 pixel cell unit 251). In the same or different embodiments, the A-cell or B-cell pattern may be maintained along a row direction (e.g., unillustrated column C3 would correspond to an instance of pixel cells corresponding to column C1 and unillustrated column C4 would correspond to an instance of pixel cells corresponding to column C2). It is appreciated that while individual pixel cells of the pixel cell array have a same pixel cell circuit (e.g., pixel cell circuit 205 of FIG. 2A) and each of the pairs of adjacent pixel cells have the same unit circuit (e.g., pixel cell unit circuit 225), the second row select transistors are coupled to plurality of column bitlines 110 to selectively operate in 1C, 4C, and 16C modes to generate the appropriate unbinned (e.g., 1C) or binned (e.g., 4C, 16C, etc.) image signals.

In the illustrated embodiment, three of the second row select transistors (e.g., 232-A1, 232-B1, and 232-B2) included in first 2×2 pixel cell unit 201 are coupled to first column bitline 110-1 and a different one of the second row select transistors (e.g., 232-A2) included in first 2×2 pixel cell unit 201 is coupled to a second column bitline 110-2. In the same embodiment, three of the second row select transistors (e.g., 232-B3, 232-A4, and 232-B4) included in second 2×2 pixel cell unit 251 are coupled to second column bitline 110-2 and a different one of the second row select transistors (e.g., 232-A3) included in second 2×2 pixel cell unit 251 is coupled to first column bitline 110-1. It is appreciated that the illustrated configuration of first and second row select transistors of first 2×2 pixel cell unit 201 and second 2×2 pixel cell unit 251 enables readout of a first 16C binned signal from first 2×2 pixel cell unit 201 through first column bitline 110-1 and readout of a second 16C binned signal from second 2×2 pixel cell unit 251 through second column bitline 110-2. In some embodiments, first column bitline 110-1 is adjacent to second column bitline 110-2.

It is further appreciated that the first and second row select transistors are configured such that the second row select transistor included in the first pixel cell of a given pair of adjacent pixel cells is capable of outputting a 1C image signal or a 4C binned image signal to a column bitline included in the plurality of column bitlines 110 coupled to the second row select transistor of the first pixel cell included in a given pixel cell. For example, a 1C or 4C image signal associated with pixel cell [R1, C1] or pixel cell [R2, C1] may be output to first column bitline 110-1 through second row select transistor 232-A1. Similarly, a 1C or 4C image signal associated with pixel cell [R1, C2] or pixel cell [R2, C2] may be output to second column bitline 110-2 through second row select transistor 232-A2).

More generally, it is appreciated that in some embodiments the second row select transistor (e.g., 232-A1, 232-A2, 232-A3, and 232-A4) included in the first pixel cells (e.g., pixel cells [R1, C1], [R1, C2], [R3, C1], and [R3, C2]) of pairs of adjacent pixel cells are coupled to output 1C image signals or 4C binned image signals while the second row select transistor (e.g., 232-B1, 232-B2, 232-B3, and 232-B4) included in the second pixel cells (e.g., pixel cells [R2, C1], [R2, C2], [R4, C1], and [R4, C2]) of pairs of adjacent pixel cells are coupled to output 16C binning image signals. Accordingly, by having pairs of adjacent pixel cells share second row select transistors as illustrated in FIG. 2D, image signals may be selectively output to first column bitline 110-1 or second column bitline 110-2.

FIG. 2E illustrates an example layout for 2×2 pixel cell units 201 and 251 of FIG. 2D, in accordance with an embodiment of the disclosure. The illustrated embodiment of FIG. 2E includes a plurality of pixel cells arranged in rows and columns (e.g., pixel cells [R1, C1], [R1, C2], [R2, C1], [R2, C2], [R3, C1], [R3, C2], [R4, C1], and [R4, C2]]) to form first 2×2 pixel cell unit 201 and second 2×2 pixel cell unit 251. It is appreciated that letter and number suffixes of reference labels illustrated in FIG. 2E follow the same scheme as discussed in reference to FIG. 2D. It is further appreciated that reference labels with a "G" suffix corresponds a gate electrode of the same numbered referenced label (e.g., 230G-A1 illustrated in FIG. 2E corresponds to a gate electrode of first row select transistor 230-A1 illustrated in FIG. 2D). Additionally, it is appreciated that not every element of FIG. 2E is necessarily labeled or discussed. Rather, one of ordinary skill in the art will be able to interpret elements of FIG. 2E based on the context of other embodiments throughout the disclosure.

The illustrated embodiment of FIG. 2E includes, inter alia, gate 230G-A1 of first row select transistor 230-A1, gate 232G-A1 of second row select transistor 232-A1, 230G-A2 of first row select transistor 230-A2, gate 232G-A2 of second row select transistor 232-A2, gate 230G-B1 of first row select transistor 230-B1, gate 232G-B1 of second row select transistor 232-B1, gate 230G-B2 of first row select transistor 230-B2, gate 232G-B2 of second row select transistor 232-B2, gate 230G-A3 of first row select transistor 230-A3, gate 232G-A3 of second row select transistor 232-A3, gate 230G-A4 of first row select transistor 230-A4, gate 232G-A4 of second row select transistor 232-A4, gate 230G-B3 of first row select transistor 230-B3, gate 232G-B3 of second row select transistor 232-B3, gate 230G-B4 of first row select transistor 230-B4, gate 232G-B4 of second row select transistor 232-B4, common junctions 235-1, 235-2, 235-3, and 235-4, source/drain region 244-A1 of second row select transistor 232-A1, source/drain region 244-A2 of second row select transistor 232-A2, source/drain region 244-A3 of second row select transistor 232-A3, source/drain region 244-A4 of second row select transistor 232-A4, source/drain region 244-B1 of second row select transistor 232-B1, source/drain region 244-B2 of second row select transistor 232-B2, source/drain region 244-B3 of second row select transistor 232-B3, source/drain region 244-B4 of second row select transistor 232-B4, and interconnects 252-1, 252-2, 252-3, and 252-4.

In the illustrated embodiment, each of common junction 235-1, common junction 235-2, common junction 235-3 and common junction 235-4 correspond to a doped region formed within semiconductor material 202. Gate 232G-A1 is disposed between common junction 235-1 and source/drain region 244-A1 of second row select transistor 232-A1. Gate 232G-B1 is disposed between common junction 235-1 and source/drain region 244-B1 of second row select transistor 232-B1. Gate 232G-A2 is disposed between common junction 235-2 and source/drain region 244-A2 of second row select transistor 232-A2. Gate 232G-B2 is disposed between common junction 235-2 and source/drain region 244-B2 of second row select transistor 232-B2. Gate 232G-A3 is disposed between common junction 235-3 and source/drain region 244-A3 of second row select transistor 232-A3. Gate 232G-B3 is disposed between common junction 235-3 and source/drain region 244-B3 of second row select transistor 232-B3. Gate 232G-A4 is disposed between common junction 235-4 and source/drain region 244-A4 of second row select transistor 232-A4. Gate 232G-B4 is disposed between common junction 235-4 and source/drain region 244-B4 of second row select transistor 232-B4. It is appreciated that common junctions 235-1, 235-2, 235-3, and 235-4 are examples of how to implement 4-terminal nodes 234-1, 234-2, 234-3, and 234-4 illustrated in FIG. 2C. In some embodiments, common junctions 235-1, 235-2, 235-3, and 235-4 are formed of same conductive type as floating diffusion of pixel cells.

It is appreciated that the organization of components within the illustrated pixel cell array of FIG. 2E facilitates improved space utilization, reduced parasitic capacitance, and multi-mode (e.g., 1C, 4C, and 16C) readout operation. In particular, the configuration of the second row select transistors allows for direct coupling between second and first row select transistors of vertically adjacent pixel cells without the use of metal wires (e.g., via common junctions 235-1, 235-2, 235-3, or 235-4) while the second row select transistors of horizontally adjacent pixel cells are coupled together through a corresponding interconnect (e.g., via interconnects 252-1 or 252-4). It is appreciated that interconnects 252-1, 252-2, 252-3, and 252-4 may be referred to as column interconnects as they couple source/drain regions of second row select transistors to the same or different column bitlines (e.g., when FIG. 2E is viewed in reference to FIG. 2D).

In the illustrated embodiment, interconnect 252-1 couple source/drain region 244-A1 of second row select transistor 232-A1, source/drain region 244-B1 of second row select transistor 232-B1, and source/rain region 244-B2 of second row select transistor 232-B2 together while also coupling the aforementioned source/drain regions to a first column bitline (e.g., column bitline 110-1 as illustrated in FIG. 2D). In the same embodiment, interconnect 252-2 couples source/drain region 244-A2 of second row select transistor 232-A2 to a second column bitline (e.g., column bitline 110-2 illustrated in FIG. 2D) adjacent to the first column bitline. In such a manner, three of the second row select transistors included in first 2×2 pixel cell unit 201 are coupled to the first column bitline while a different one the second row select transistors included in first 2×2 pixel cell unit 201 is coupled to the second column bitline. It is appreciated that this configuration is swapped for second 2×2 pixel cell units 251, which is vertically adjacent to first 2×2 pixel cell unit 201. In the illustrated embodiment, interconnect 252-3 couples source/ drain region 244-A3 of second row select transistor 232-A3 to the first column bitline (e.g., column bitline 110-1 illustrated in FIG. 2D). In the same embodiment, interconnect 252-4 couple source/drain region 244-B3 of second row select transistor 232-B3, source/drain region 244-A4 of second row select transistor 232-A4, and source/rain region 244-B4 of second row select transistor 232-B4 together while also coupling the aforementioned source/drain regions to the second column bitline (e.g., column bitline 110-2 as illustrated in FIG. 2D). In such a manner, three of the second row select transistors included in second 2×2 pixel cell unit 251 are coupled to the second column bitline while a different one of the second row select transistors included in second 2×2 pixel cell unit 251 is coupled to the first column bitline. The configuration of the first and second row select transistors included in 2×2 pixel cell units 201 and 251 in combination with interconnects 252-1, 252-2, 252-3, and 252-4 allows for multi-mode operation (e.g., 1C, 4C, and 16C) while having a same output data rate during each mode (e.g., during 1C, 4C, and 16C operation an associated ADC coupled to the first and second column bitlines may be active or otherwise in used for readout).

As discussed previously, groups of pixel cells illustrated in FIG. 2E may be described or segmented into pairs of vertically adjacent pixel cells (e.g., as discussed in context of FIG. 2D) with each of the pairs of adjacent pixel cells including a corresponding instance of a common junction (e.g., 235-1, 235-2, 235-3, and 235-4) to couple the first and second row select transistors of a given one of the pairs of adjacent pixel cells together. For example, the illustrated embodiment of FIG. 2E includes a first one of the pairs of adjacent pixel cells 211-1 (including a first pixel cell [R1, C1] and a second pixel cell [R2, C1]), a second one of the pairs of adjacent pixel cells 211-2 (including a first pixel cell [R1, C2] and a second pixel cell [R2, C2]), a third one of the pairs of adjacent pixel cells 211-3 (including a first pixel cell [R3, C1] and a second pixel cell [R4, C1]), and a fourth one of the pairs of adjacent pixel cells 211-4 (including a first pixel cell [R3, C2] and a second pixel cell [R4, C2]). In the illustrated embodiment, the first one of the pairs of adjacent pixel cells 211-1 is horizontally adjacent to the second one of the pairs of adjacent pixel cells 211-2. The first one of the pairs of adjacent pixel cells 211-1 is vertically adjacent to the third one of the pairs of adjacent pixel cells 211-3. The second one of the pairs of adjacent pixel cells 211-2 is vertically adjacent to the fourth one of the pairs of adjacent pixel cells 211-4. The first one of the pairs of adjacent pixel cells 211-1 is diagonally adjacent to the fourth one of the pairs of adjacent pixel cells 211-4.

In the illustrated embodiment, gates of second row select transistors (e.g., 232G-A1, 232G-B1, 232G-A2, and 232G-B2) of the first and the second pixel cells included in the first one of the pairs of adjacent pixel cells 211-1 and the second one of the pairs of adjacent pixel cells 211-2 are aligned (e.g., a straight line is coincident with edges or midpoints of each of the aforementioned gates). More generally, in some embodiments gates of second row select transistors that are associated with a same row may be aligned. For example, gates of second row select transistors (e.g., 232G-A3, 232G-B3, 232G-A4, and 232G-B4) of the first and the second pixel cells included in the third one of the pairs of adjacent pixel cells 211-3 and the fourth one of the pairs of adjacent pixel cells 211-4 are aligned (e.g., a straight line is coincident with edges or midpoints of each of the aforementioned gates).

In the illustrated embodiment, gates of first row select transistors that are associated with a same column may be aligned. For example, gates of first row select transistors included in pairs of adjacent pixel cells that are vertically adjacent to one another may be aligned in embodiments of the disclosure. In one embodiment, gates of first row select transistors (e.g., 230G-A1, 230G-B1, 230G-A3, and 230G-B3) of the first and the second pixel cells included in the first one of the pairs of adjacent pixel cells 211-1 and the third one of the pairs of adjacent pixel cells 211-3 are aligned (e.g., a straight line is coincident with edges or midpoints of each of the aforementioned gates). In the same embodiment, gates of first row select transistors (e.g., 230G-A2, 230G-B2, 230G-A4, and 230G-B4) of the first and the second pixel cells included in the second one of the pairs of adjacent pixel cells 211-2 and the fourth one of the pairs of adjacent pixel cells 211-4 are aligned (e.g., a straight line is coincident with edges or midpoints of each of the aforementioned gates).

As illustrated in FIG. 2E, interconnect 252-1 couples the second row select transistors of the first one of the pairs of adjacent pixel cells 211-1 (e.g., second row select transistors 232-A1 and 232-B1) to a closest one of the second row select transistors included in a second one of the pairs of adjacent pixel cells 211-2 (e.g., second row select transistor 232-B2). Similarly, interconnect 252-4 couples the second row select transistors of the fourth one of the pairs of adjacent pixel cells 211-4 (e.g., second row select transistors 232-A4 and 232-B4) to a closest one of the second row select transistors included in a third one of the pairs of adjacent pixel cells 211-3 (e.g., second row select transistor 232-B3).

In the illustrated embodiment, the first pixel cell (e.g., pixel cell [R1, C1]) included in the first one of the pairs of adjacent pixel cells 211-1 is horizontally adjacent to the first pixel cell (e.g., pixel cell [R1, C2]) of the second one of the pairs of adjacent pixel cell 211-2. In the same embodiment, the first pixel cell (e.g., pixel cell [R3, C1]) included in the third one of the pairs of adjacent pixel cells 211-3 is horizontally adjacent to the first pixel cell (e.g., pixel cell [R3, C2]) of the fourth one of the pairs of adjacent pixel cell 211-4. In some embodiments, interconnect 252-1 couples the second row select transistor included in the second pixel cell (e.g., pixel cell [R2, C1]) of the first one of the pairs of adjacent pixel cells 211-1 with the second row select transistor of the second pixel cell (e.g., pixel cell [R2, C2]) included in second one of the pairs of adjacent pixel cells 211-2. In some embodiments, interconnect 252-1 extends over common junction 235-1. Similarly, interconnect 252-4 couples the second row select transistor included in the second pixel cell (e.g., pixel cell [R4, C2]) of the fourth one of the pairs of adjacent pixel cells 211-4 with the second row select transistor of the second pixel cell (e.g., pixel cell [R4, C1]) included in third one of the pairs of adjacent pixel cells 211-3. In some embodiments, interconnect 252-4 extends over common junction 235-4. In some embodiments, interconnections 252-1 and 254-4 are offset from one another (e.g., edges and midpoints are not aligned).

In the illustrated embodiment, it is appreciated that horizontal transistor regions (e.g., 265, 266, and 267) alternate between second row select transistors and reset/dual floating diffusion transistors. For example, transistor region 267 alternates between reset gates (RST) and dual floating diffusion gates (DFD) while transistor region 265 alternates between second row select transistors of first pixel cells and second pixel cells (e.g., as indicated by 232G-A1, 232G-B2, 232G-A2 gates). Put in another way, a row of gates for second row select transistors are disposed between a rows of gates for reset and dual floating diffusion transistors in some embodiments of the disclosure.

It is appreciated that embodiments of the disclosure illustrated in FIG. 1A through FIG. 2E may be fabricated using conventional semiconductor device processing and microfabrication techniques known by one of ordinary skill in the art, which may include, but is not limited to, photolithography, ion implantation, chemical vapor deposition, physical vapor deposition, thermal evaporation, sputter deposition, reactive-ion etching, plasma etching, wafer bonding, chemical mechanical planarization, and the like. It is appreciated that the described techniques are merely demonstrative and not exhaustive and that other techniques may be utilized to fabricate one or more components of various embodiments of the disclosure.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell array disposed in or on a semiconductor material, comprising:

- a plurality of pixel cells arranged into rows and columns including a first pixel cell and a second pixel cell adjacent to the first pixel cell, wherein each pixel cell included in the plurality of pixel cells includes:
  - one or more photodiodes configured to generate image charge in response to incident light;
  - a floating diffusion coupled to receive the image charge generated by the one or more photodiodes;
  - a source-follower transistor having a gate coupled to the floating diffusion to generate an image signal at a first source/drain region of the source-follower transistor in response to the image charge in the floating diffusion;
  - a first row select transistor having a first source/drain region coupled to the first source/drain region of the source-follower transistor to output the image signal; and
  - a second row select transistor having a first source/drain region coupled to a second source/drain region of the first row select transistor, and
- a common junction disposed in the semiconductor material, wherein the first source/drain regions of the second row select transistors included in the first and the second pixel cells are coupled together through the common junction.

2. The pixel cell array of claim 1, wherein the first source/drain region of the second row select transistor is coupled to the second source/drain region of the first row select transistor through the common junction for the first and the second pixel cells.

3. The pixel cell array of claim 1, wherein the first and the second row select transistors included in the first and the second pixel cells are coupled together without metal wiring.

4. The pixel cell array of claim 1, further comprising a transistor region disposed between the one or more photodiodes of the first pixel cell and the one or more photodiodes of the second pixel cell, and wherein the common junction is disposed within the transistor region.

5. The pixel cell array of claim 4, wherein a cross-section of the pixel cell array along a direction parallel to a column direction extends through the transistor region, the common junction, the gates of the source-follower transistors included in the first and the second pixel cells, and gates of the first row select transistors included in the first and the second pixel cells.

6. The pixel cell array of claim 1, wherein the gate of the first row select transistor included in the first pixel cell and the gate of the first row select transistor included in the second pixel cell are disposed between the gate of the source-follower transistor included in the first pixel cell and the gate of the source-follower transistor included in the second pixel cell.

7. The pixel cell array of claim 1, wherein a gate of the first row select transistor included in the first pixel cell is disposed between a pair of photodiodes included in one or more photodiodes of the first pixel cell, and wherein a gate of the first row select transistor included in the second pixel cell is disposed between a pair of photodiodes included in the one or more photodiodes of the second pixel cell, and wherein the common junction is disposed between the gate of the first row select transistor included in the first pixel cell and the gate of the second row select transistor included in the second pixel cell.

8. The pixel cell array of claim 1, wherein the floating diffusion of the first pixel cell is a split floating diffusion including a first portion and a second portion physically separated from the first portion, wherein the first portion and the second portion are formed in the semiconductor material, wherein the first portion is disposed between a first pair of photodiodes included in the one or more photodiodes of the first pixel cell and the gate of the source-follower transistor of the first pixel cell, wherein the second portion is disposed between a second pair of photodiodes included in the one or more photodiodes of the first pixel cell and the gate of the source-follower transistor of the first pixel cell.

9. The pixel cell array of claim 1, wherein the plurality of pixel cells is organized into pairs of adjacent pixel cells, each including respective instances of the first pixel cell and the second pixel cell.

10. The pixel cell array of claim 9, wherein a first one of the pairs of adjacent pixel cells is horizontally adjacent to a second one of the pairs of adjacent pixel cells, and wherein gates of the second row select transistors of the first and the second pixel cells included in the first one of the pairs of adjacent pixel cells and the second one of the pairs of adjacent pixel cells are aligned.

11. The pixel cell array of claim 9, further comprising an interconnect coupling the second row select transistors of a first one of the pairs of adjacent pixel cells to a closest one of the second row select transistors included in a second one of the pairs of adjacent pixel cells.

12. The pixel cell array of claim 9, wherein a first one of the pairs of adjacent pixel cells is vertically adjacent to a third one of the pairs of adjacent pixel cells, and wherein gates of the first row select transistors of the first and the second pixel cells included in the first one of the pairs of adjacent pixel cells and the third one of the pairs of adjacent pixel cells are aligned.

13. The pixel cell array of claim 9, wherein the pairs of adjacent pixel cells includes a first one, a second one, a third one, and a fourth one to form 2×2 pixel cell unit structures, wherein the first one is horizontally adjacent to the second one and vertically adjacent to the third one, wherein the fourth one is horizontally adjacent to the third one and vertically adjacent to the second one.

14. The pixel cell array of claim 13, wherein the first pixel cell of the first one of the pairs of adjacent pixel cells is horizontally adjacent to the first pixel cell of the second one of the pairs of adjacent pixel cell, wherein the first pixel cell of the third one of the pairs of adjacent pixel cells is horizontally adjacent to the first pixel cell of the fourth one of the pairs of adjacent pixel cells, wherein the pixel cell array further comprises a first interconnect coupling the second row select transistor included in the second pixel cell of the first one of the pairs of adjacent pixel cells with the second row select transistor of the second pixel cell included in second one of the pairs of adjacent pixel cells.

15. The pixel cell array of claim 14, wherein the common junction is associated with the first one of the pairs of adjacent pixel cells, and wherein the first interconnect extends over the common junction.

16. The pixel cell array of claim 14, wherein the pixel cell array further comprises a second interconnect coupling the second row select transistors included in the first pixel cell and the second pixel cell of the fourth one of the pairs of adjacent pixel cells with the second row select transistor of the second pixel cell included in third one of the pairs of adjacent pixel cells.

17. The pixel cell array of claim 9, wherein each of the pairs of adjacent pixel cells includes a corresponding instance of the common junction.

18. An imaging system, comprising:

a pixel cell array disposed in or on a semiconductor material, the pixel cell array including a plurality of pixel cells arranged into rows and columns, the plurality of pixel cells including a first pixel cell and a second pixel cell adjacent to the first pixel cell, and wherein each pixel cell included in the plurality of pixel cells includes:

one or more photodiodes;

a floating diffusion coupled to the one or more photodiodes;

a source-follower transistor having a gate coupled to the floating diffusion;

a first row select transistor and a second row select transistor, wherein the first row select transistor is coupled between the source-follower transistor and the second row select transistor;

a common junction coupled between a gate of the first row select transistor included in the first pixel cell and a gate of the first row select transistor of the second pixel cell, wherein the common junction is further coupled between a gate of the second row select transistor included in the first pixel cell and a gate of the second row select transistor included in the second pixel cell.

19. The imaging system of claim 18, further comprising a plurality of column bitlines including a first column bitline, wherein the gate of the second row select transistor included in the first pixel cell is disposed between the common junction and a source/drain region of the second row select transistor included in the first pixel cell, wherein the gate of the second row select transistor included in the second pixel cell is disposed between the common junction and a source/drain region of the second row select transistor included in the second pixel cell, and wherein the source/drain regions of the second row select transistor included in the first pixel cell and the second pixel cell are coupled to the first column bitline.

20. The imaging system of claim 18, further comprising a plurality of column bitlines including a first column bitline and a second column bitline adjacent to the first column bitline, wherein the plurality of pixel cells are organized into pairs of adjacent pixel cells, each including respective instances of the first pixel cell and the second pixel cell with the first pixel cell vertically adjacent to the second pixel cell, wherein a first one of the pairs of adjacent pixel cells is horizontally adjacent to a second one of the pairs of adjacent pixel cells, wherein source/drain regions of the second row select transistors included in the first and the second pixel cells of the first one of the pairs of adjacent pixel cells are coupled to the first column bitline, wherein a source/drain region of the second row select transistor included in the first pixel cell of the second one of the pairs of adjacent pixel cells is coupled to the first column bitline, and wherein a source/drain region of the second row select transistor included in the first pixel cell of the second one of the pairs of adjacent pixel cells is coupled to the second column bitline.

* * * * *